United States Patent
Bienaime

(10) Patent No.: US 11,530,720 B2
(45) Date of Patent: Dec. 20, 2022

(54) SYSTEM FOR CONTROLLING AT LEAST ONE ACTIVE MAGNETIC BEARING EQUIPPING A ROTATING MACHINE COMPRISING A ROTOR AND A STATOR, AND CORRESPONDING METHOD

(71) Applicant: SKF Magnetic Mechatronics, Saint-Marcel (FR)

(72) Inventor: Francis Bienaime, Mont Saint-Aignan (FR)

(73) Assignee: SKF Magnetic Mechatronics, Saint-Marcel (FR)

( * ) Notice: Subject to any disclaimer, the term of this patent is extended or adjusted under 35 U.S.C. 154(b) by 5 days.

(21) Appl. No.: 17/171,215

(22) Filed: Feb. 9, 2021

(65) Prior Publication Data

US 2021/0270317 A1 Sep. 2, 2021

(30) Foreign Application Priority Data

Mar. 2, 2020 (FR) ...................................... 2002075

(51) Int. Cl.
*F16C 32/04* (2006.01)
*H03H 17/02* (2006.01)
(Continued)

(52) U.S. Cl.
CPC .......... *F16C 32/0451* (2013.01); *H02P 21/13* (2013.01); *H02P 21/18* (2016.02); *H03H 17/0202* (2013.01); *H03H 2017/0205* (2013.01)

(58) Field of Classification Search
CPC .............. F16C 32/0451; F16C 2360/44; F16C 2360/45; F16C 2300/02; F16C 32/0455; F16C 32/048; F16C 32/0453; F16C 32/0446; H03H 17/0202; H03H 2017/0205; H02P 21/18; H02P 21/13
(Continued)

(56) References Cited

U.S. PATENT DOCUMENTS 5,576,587 A * 11/1996 Takahashi ........... F16C 32/0453
318/632
5,760,510 A * 6/1998 Nomura .............. F16C 32/0455
310/90.5
(Continued)

FOREIGN PATENT DOCUMENTS

EP 0201894 A2 11/1986
WO WO 2011/120764 * 10/2011

*Primary Examiner* — Ahmed Elnakib
(74) *Attorney, Agent, or Firm* — Garcia-Zamor Intellectual Property Law; Ruy Garcia-Zamor; Bryan Peckjian

(57) ABSTRACT

System for controlling at least one active magnetic bearing equipping a rotating machine comprising a rotor and a stator, at least one means for measuring the radial positions of the rotor as a function of the signal from at least one position sensor, and at least two control loops of the active magnetic bearing as a function of the radial positions of the rotor, each control loop of the magnetic bearing being provided with at least one synchronous filter as a function of the rotation speed, and an extended Kalman filter for determining the rotation speed of the rotor with respect to the stator receiving as input, from position sensors, measurements of radial position of the rotor and as a function of measurements of radial position of the rotor performed over a predetermined time at zero rotor rotation speed.

16 Claims, 2 Drawing Sheets

(51) Int. Cl.
*H02P 21/13* (2006.01)
*H02P 21/18* (2016.01)

(58) Field of Classification Search
USPC .......................................................... 310/90.5
See application file for complete search history.

(56) References Cited

U.S. PATENT DOCUMENTS

2004/0257023 A1* 12/2004 Tamisier ............. F16C 32/0451
                                                                   318/632
2021/0270317 A1* 9/2021 Bienaime ............ F16C 32/0451

* cited by examiner

[Fig 1]
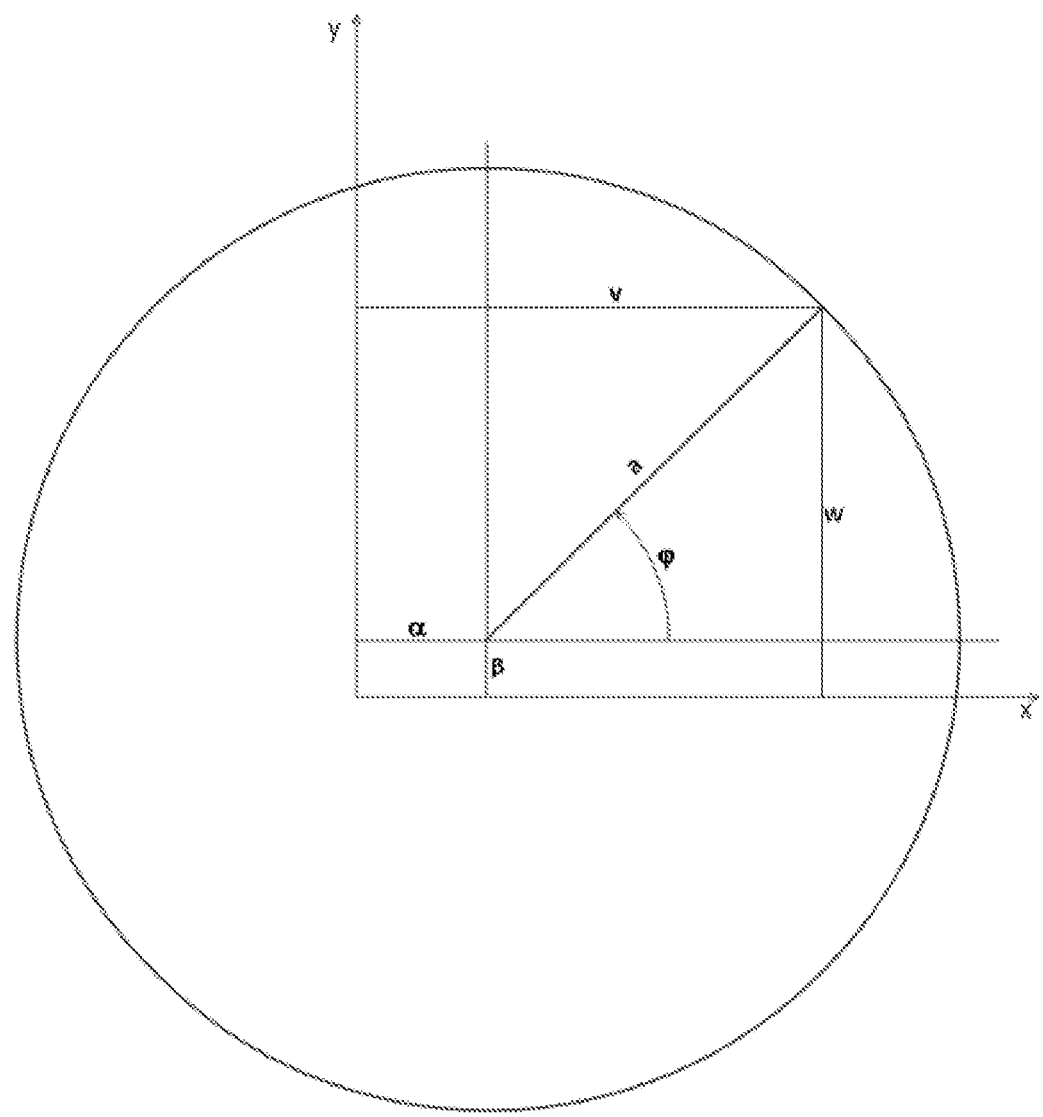

[Fig 2]
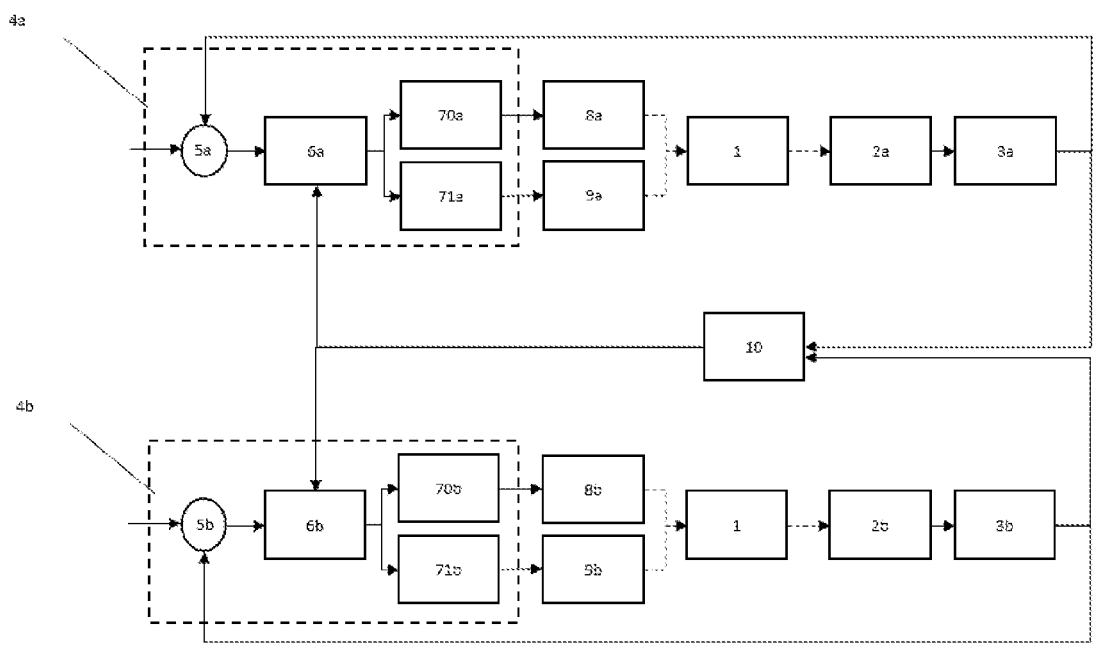

SYSTEM FOR CONTROLLING AT LEAST ONE ACTIVE MAGNETIC BEARING EQUIPPING A ROTATING MACHINE COMPRISING A ROTOR AND A STATOR, AND CORRESPONDING METHOD

CROSS-REFERENCE TO RELATED APPLICATIONS

This application claims priority to French Patent Application no. 2002075, filed Mar. 2, 2020, the contents of which is fully incorporated herein by reference.

TECHNICAL FIELD OF THE INVENTION

The technical field of the invention is the control of rotating machines, and more particularly the control of such machines provided with a magnetic bearing.

BACKGROUND OF THE INVENTION

Most industrial applications using an active magnetic bearing AMB require the rotation speed of the rotor to activate synchronous filtering systems such as an active balancing system ABS (the acronym for "automatic balancing system"), an adaptive vibration rejection system AVR (the acronym for "adaptive vibration rejection") and an optimal damping control system ODC (the acronym for "optimum damping control").

These filters are a necessary part in the control of a magnetic bearing MBC (the acronym for "magnetic bearing controller").

The rotation speed is determined by involving additional devices, such as speed sensors, electrical machine power signal measurement maps or an induction-based measurement system, etc.

Nevertheless, these estimation devices present the drawback of an additional cost, of constituting a source of failures, and of insufficient accuracy for certain applications.

There is an issue in obtaining the rotation speed of a rotor guided by AMB without any additional device, on the basis solely of the internal signals of the AMB.

This information is necessary to the user for process control and safety reasons.

This information is also necessary for the control loop of the AMB, to be able to perform the synchronous filtering (ABS, AVR & ODC) as presented above.

SUMMARY OF THE INVENTION

The subject of the invention is a system for controlling at least one active magnetic bearing equipping a rotating machine comprising a rotor and a stator, the control system being provided with at least one means for measuring the radial positions of the rotor with respect to the stator as a function of the signal from at least two position sensors, and at least two loops for controlling the active magnetic bearing as a function of the radial positions of the rotor, each control loop of the magnetic bearing being provided with at least one synchronous filter that is a function of the rotation speed of the rotor. The system comprises a means for determining the rotation speed of the rotor with respect to the stator receiving, as input, from a measurement means, measurements of the radial positions of the rotor and as a function of measurements of the radial positions of the rotor performed over a predetermined time while the rotation speed of the rotor is zero.

The means for determining the rotation speed can comprise an extended Kalman filter.

The state vector can depend on the angular position of the rotor, on the rotation speed of the rotor, on offset values and on the radius of the orbit described by the position sensor.

The extended Kalman filter can be initialized by a state vector that is a function of the mean deviation of the radial positions of the rotor at zero rotation speed and by a covariance matrix that is a function of the standard deviations of the radial positions of the rotor at zero rotation speed over the predetermined measurement time.

With the rotating machine being provided with a second active magnetic bearing, the means for determining the rotation speed of the rotor can receive, as input from a measurement means of the second active magnetic bearing, measurements of radial position of the rotor and measurements of radial position of the rotor performed over a predetermined time while the rotation speed of the rotor is zero, the means for determining the rotation speed of the rotor being configured to determine the rotation speed of the rotor as a function of the measurements received from the measurement means of the two active magnetic bearings.

In this embodiment, the means for determining the rotation speed can comprise an extended Kalman filter.

The extended Kalman filter can be initialized by a state vector that is a function of the mean deviation of the angular position of the rotor at zero rotation speed and by a covariance matrix that is a function of the standard deviation of the radial position of the rotor at zero rotation speed over the predetermined measurement time, determined by each of the measurement means.

The state vector can depend on the angular position of the rotor, on the rotation speed of the rotor, on offset values and on the radius of the orbit described by the position sensors, on the measurement means of the first active magnetic bearing, and the angular position of the rotor, on the rotation speed of the rotor, on offset values and on the radius of the orbit described by the position sensors, received from the measurement means of the second active magnetic bearing and a value of the angular phase shift between the two active magnetic bearings in order to take account of the possible movements of the rotor.

The measurement means can be configured to determine the radial position values of the rotor at the sampling frequency of the MBC control loop, the means for determining the rotation speed performing extending extended Kalman filter prediction and updating operations at the same frequency as the sampling frequency of the control loop of the magnetic bearing.

Another subject of the invention is a method for controlling at least one active magnetic bearing equipping a rotating machine comprising a rotor and a stator, the control method comprising at least one step of measurement of the radial position of the rotor with respect to the stator as a function of the signal from at least two position sensors, and at least one step of control of the active magnetic bearing as a function of the radial position of the rotor, the step of control of the magnetic bearing comprising at least one step of synchronous filtering as a function of the rotation speed of the rotor, the method further comprising a step of determination of the rotation speed of the rotor with respect to the stator as a function of the measurements, performed during a measurement step, of radial position of the rotor and of radial position of the rotor performed over a predetermined time while the rotation speed of the rotor is zero.

The control system and method according to the invention present the advantage of reducing the cost of the control of a rotating machine by allowing the means for determining the rotation speed that are conventionally used to be eliminated.

The control system and method according to the invention present the advantage of supplying a second measurement signal when they are employed in addition to the means for determining the rotation speed that are conventionally used.

BRIEF DESCRIPTION OF THE DRAWINGS

Other aims, features and advantages of the invention will become apparent on reading the following description, given purely as a nonlimiting example and with reference to the attached drawings in which:

FIG. 1 illustrates the radial positions of a point rotating in a fixed orthogonal reference frame, and FIG. 2 illustrates a control system according to the invention.

DETAILED DESCRIPTION OF THE INVENTION

The control system according to the invention processes signals originating from sensors of radial position of the rotor with respect to the stator in order to determine rotation speed. Such position sensors inherently and necessarily form part of a magnetic bearing AMB. A control loop employs these signals to control the bearing AMB.

The control system according to the invention employs statistical data on the radial position signal of the rotor in combination with an extended Kalman filter to determine the rotation speed of the rotor.

A magnetic bearing makes it possible to modify the position of an axis in each of the two directions contained in a plane normal to the axis. For each direction, a required displacement is determined which is then transformed into commands transmitted to two actuators (electromagnet). Each actuator produces an attractive magnetic force on the axis that allows it to be attracted. A displacement is then obtained based on the difference of attraction between the two actuators.

For a magnetic bearing, it is then necessary to determine a displacement in one direction and another displacement in another direction, generally orthogonal. These displacements are translated into commands intended for four actuators, two actuators per direction.

For the rest of the description, a radial position is defined as the coordinates (v,w) of a point rotating in a fixed orthogonal reference frame.

The values α, βa, φ,v,w are illustrated by FIG. 1.

FIG. 2 shows a rotor 1, whose angular position, according to a first direction of the reference frame (x,y) illustrated in FIG. 1 is determined by a measurement means 3a as a function of signals from radial position sensors 2a. The magnetic bearing supporting the rotor 1 is controlled for the displacements in the first direction of the reference frame (x,y) by a setpoint received by a first subtractor 5a. The first subtractor 5a emits an error signal as a function of the difference between the setpoint and the measurement of position determined by the measurement means 3a. The error signal is then filtered by at least one synchronous filter 6a before being transmitted to two control loops 70a, 71a. The control loops 70a, 71a each determine position commands according to the first direction of the reference frame (x,y) intended respectively for the actuators 8a, 9a of the magnetic bearing. The first subtractor 5a, the at least one synchronous filter 6a, and the control loops 70a, 71a may comprise a first controller 4a.

It can also be seen that the angular position of the rotor 1 according to a second direction of the reference frame (x,y) illustrated in FIG. 1 is determined by a measurement means 3b as a function of signals from radial position sensors 2b. The magnetic bearing supporting the rotor 1 is controlled for the displacements in the second direction of the reference frame (x,y) by a setpoint received by a second subtractor 5b. The second subtractor 5b emits an error signal as a function of the difference between the setpoint and the measurement of position determined by the measurement means 3b. The error signal is then filtered by at least one synchronous filter 6b before being transmitted to two control loops 70b, 71b. The control loops 70b, 71b determine position commands according to the second direction intended respectively for the actuators 8b, 9b of the magnetic bearing. The second subtractor 5b, the at least one synchronous filter 6b, and the two control loops 70b, 71b may comprise a first controller 4a.

A determination means 10 makes it possible to determine a rotor rotation speed signal intended for the synchronous filters 6a, 6b as a function of the radial positions determined by the measurement means 3a, 3b.

A control system according to the invention can also be seen, in which a determination means 10 of extended Kalman filter EKF type receives, as input, an estimated radial position of the rotor according to the axis x of a reference frame linked to the stator and an estimated position of the rotor according to the axis y of the reference frame linked to the stator that are received from the measurement means 3a, 3b. It will be noted that the axis z of the orthogonal reference frame (x,y,z) coincides with the axis of rotation of the rotor.

The extended Kalman filter then determines an estimated rotation speed transmitted to each synchronous filter of the control loop of the active magnetic bearing.

In a first approach, so as to reduce the processing time of the EKF, it is proposed to choose the state vector x reduced to its simplest expression:

$$x = [\varphi \; \dot{\varphi} \; \alpha \; \beta \; a]^T$$

With:

φ: angle of rotation about the axis z $$\dot{\varphi} = \frac{d\varphi}{dt} = \Omega:$$

rotation speed
α: offset according to the axis x
β: offset according to the axis y
a: radius of the orbit described by the radial position sensors The state model of the EKF is simple and linear. It can be expressed as follows:

$$\dot{x} = \frac{dx}{dt} = [\dot{\varphi} \; \ddot{\varphi} \; \dot{\alpha} \; \dot{\beta} \; \dot{a}]^T = A \cdot x = [\dot{\varphi} \; 0 \; 0 \; 0 \; 0]^T$$

With:

$$A = \begin{bmatrix} 0 & 1 & 0 & 0 & 0 \\ 0 & 0 & 0 & 0 & 0 \\ 0 & 0 & 0 & 0 & 0 \\ 0 & 0 & 0 & 0 & 0 \\ 0 & 0 & 0 & 0 & 0 \end{bmatrix}$$

The value expected for the selective filter employed by the ABS, AVR and ODC AMB control modes takes the following form:

$$x_2 = \dot{\varphi} = \Omega$$

Whereas the model of the observer for the EKF is:

$$y = \begin{bmatrix} v \\ w \end{bmatrix} = \begin{bmatrix} \alpha + a \cdot \cos(\varphi) \\ \beta + a \cdot \sin(\varphi) \end{bmatrix}$$

It is not necessary to posit hypotheses concerning the dynamic behaviour of the values $\Omega$, $\alpha$, $\beta$ and a, but their initial values and the characteristics of the noise affecting some of them can be determined when the rotor is in a stationary state, being levitated without rotation.

It is then proposed to measure signals v and w, in the stationary state for a time T, in order to initialize the state vector.

The following matrices $x_0$ and $P_0$ are then defined:

$$x_0 = [0 \ 0 \ \mu_v \ \mu_w \ 0]^T$$

$$P_0 = \begin{bmatrix} 0 & 0 & 0 & 0 & 0 \\ 0 & 0 & 0 & 0 & 0 \\ 0 & 0 & \sigma_v^2 & 0 & 0 \\ 0 & 0 & 0 & \sigma_w^2 & 0 \\ 0 & 0 & 0 & 0 & 0 \end{bmatrix}$$

With:
$\mu_v$: mean deviation of the signal v
$\mu_w$: mean deviation of the signal w
$\tau_v$: standard deviation of the signal v
$\tau_w$: standard deviation of the signal w The mean deviations and standard deviations are determined at the sampling frequency of the MBC control loop.

It is proposed to perform the filter prediction and updating operations at the same frequency as the sampling frequency of the MBC control loop.

In another embodiment, an EKF filter is used receiving, as input, the estimated angular position of the rotor according to the axis x of a reference frame linked to the stator and the estimated position of the rotor according to the axis y of the reference frame linked to the stator of a first AMB measurement means as in the first embodiment, but also the estimated angular position of the rotor according to the axis x of a reference frame linked to the stator and the estimated position of the rotor according to the axis y of the reference frame linked to the stator of a second measurement means, linked to a second AMB. In fact, in general, two AMBs are employed to guide a rotating machine rotor. Consequently, there are two measurement devices available that are proposed to be used redundantly to supply the EKF filter.

For all the rest of the description, indices 1 and 2 identifying the relative values are defined, respectively, by the measurement means of the first AMB and by that of the second AMB.

In such an embodiment, the state vector becomes:
$$x = [\varphi \ \dot{\varphi} \ \alpha_1 \ \beta_1 \ a_1 \ \alpha_2 \ \beta_2 \ a_2 \ \Delta \varphi]^T$$

Since there is generally a phase shift between the two AMB measurement means, a phase shift variable $\Delta_{100}$ is introduced into the state vector.

The state model is then as follows:

$$\dot{x} = \frac{dx}{dt} = [\dot{\varphi} \ \ddot{\varphi} \ \dot{\alpha}_1 \ \dot{\beta}_1 \ \dot{a}_1 \ \dot{\alpha}_2 \ \dot{\beta}_2 \ \dot{a}_2 \ \Delta\dot{\varphi}]^T = A \cdot x = [\dot{\varphi} \ 0 \ 0 \ 0 \ 0 \ 0 \ 0 \ 0 \ 0]^T$$

With:

$$A = \begin{bmatrix} 0 & 1 & 0 & 0 & 0 & 0 & 0 & 0 & 0 \\ 0 & 0 & 0 & 0 & 0 & 0 & 0 & 0 & 0 \\ 0 & 0 & 0 & 0 & 0 & 0 & 0 & 0 & 0 \\ 0 & 0 & 0 & 0 & 0 & 0 & 0 & 0 & 0 \\ 0 & 0 & 0 & 0 & 0 & 0 & 0 & 0 & 0 \\ 0 & 0 & 0 & 0 & 0 & 0 & 0 & 0 & 0 \\ 0 & 0 & 0 & 0 & 0 & 0 & 0 & 0 & 0 \\ 0 & 0 & 0 & 0 & 0 & 0 & 0 & 0 & 0 \\ 0 & 0 & 0 & 0 & 0 & 0 & 0 & 0 & 0 \end{bmatrix}$$

The observation model is then as follows:

$$y = \begin{bmatrix} v_1 \\ w_1 \\ v_2 \\ w_2 \end{bmatrix} = \begin{bmatrix} \alpha_1 + a_1 \cdot \cos(\varphi) \\ \beta_1 + a_1 \cdot \sin(\varphi) \\ \alpha_2 + a_2 \cdot \cos(\varphi + \Delta\varphi) \\ \beta_2 + a_2 \cdot \sin(\varphi + \Delta\varphi) \end{bmatrix}$$

As for the first embodiment, the state vector and the covariance matrix must be initialized by data originating from position measurements, in a stationary state, and from the determination of their static characteristics (mean and standard deviations).

The following initial state vector $x_0$ and covariance matrix $P_0$ are then obtained:

$$x_0 = [0 \ 0 \ \mu_{v1} \ \mu_{w1} \ 0 \ \mu_{v2} \ \mu_{v2} \ 0 \ 0]^T$$

$$P_0 = \begin{bmatrix} 0 & 0 & 0 & 0 & 0 & 0 & 0 & 0 & 0 \\ 0 & 0 & 0 & 0 & 0 & 0 & 0 & 0 & 0 \\ 0 & 0 & \sigma_{v1}^2 & 0 & 0 & 0 & 0 & 0 & 0 \\ 0 & 0 & 0 & \sigma_{w1}^2 & 0 & 0 & 0 & 0 & 0 \\ 0 & 0 & 0 & 0 & 0 & 0 & 0 & 0 & 0 \\ 0 & 0 & 0 & 0 & 0 & \sigma_{v2}^2 & 0 & 0 & 0 \\ 0 & 0 & 0 & 0 & 0 & 0 & \sigma_{w2}^2 & 0 & 0 \\ 0 & 0 & 0 & 0 & 0 & 0 & 0 & 0 & 0 \\ 0 & 0 & 0 & 0 & 0 & 0 & 0 & 0 & 0 \end{bmatrix}$$

With:
$\mu_{v1}$: mean deviation of the signal $v_1$ from the first AMB measurement means
$\mu_{w1}$: mean deviation of the signal $w_1$ from the first AMB measurement means
$\tau_{v1}$: standard deviation of the signal $v_1$ from the first AMB measurement means
$\tau_{w1}$: standard deviation of the signal $w_1$ from the first AMB measurement means
$\mu_{v2}$: mean deviation of the signal $v_2$ from the second AMB measurement means
$\mu_{w2}$: mean deviation of the signal $w_2$ from the second AMB measurement means
$\tau_{v2}$: standard deviation of the signal $v_2$ from the second AMB measurement means
$\tau_{w2}$: standard deviation of the signal $w_2$ from the second AMB measurement means The means and standard deviations are determined at the sampling frequency of the MBC control loop.

The filter prediction and updating operations are performed at the same frequency as the sampling frequency of the MBC control loop.

The invention claimed is:

1. A control system for controlling an active magnetic bearing equipping a rotating machine comprising a rotor and a stator,
   the control system being provided with at least one means for measuring radial positions of the rotor with respect to the stator as a function of a signal from at least two position sensors, and at least two control loops of the active magnetic bearing as a function of the radial positions of the rotor, each of the at least two control loops of the active magnetic bearing being provided with at least one synchronous filter that is a function of a rotation speed of the rotor with respect to the stator, the control system further comprising:
   a means for determining the rotation speed of the rotor with respect to the stator, the stator receiving as input measurements of radial position of the rotor from a measurement means, and as a function of the measurements of radial position of the rotor performed over a predetermined time while the rotation speed of the rotor is zero,
   a first actuator configured to adjust a vertical position of the rotor,
   a second actuator configured to adjust a horizontal position of the rotor,
   a third actuator configured to adjust the vertical position of the rotor, and
   a fourth actuator configured to adjust the horizontal position of the rotor, wherein
   one of the at least two control loops is in communication with the first actuator and the third actuator and another of the at least two control loops is in communication with the second actuator and the fourth actuator, the control loops commanding the actuators to modify the radial positions of the rotor by adjusting the vertical position and the horizontal position of the rotor in a plane normal to a central axis.

2. The control system according to claim 1, wherein the means for determining the rotation speed comprises an extended Kalman filter.

3. The control system according to claim 2, wherein a state vector depends on an angular position of the rotor, on the rotation speed of the rotor, on values of offset, and on a radius of an orbit described by the at least two position sensors.

4. The control system according to claim 1, wherein the measurement means is configured to determine the values of radial position of the rotor at a sampling frequency of the at least two control loops, the means for determining the rotation speed performing extended Kalman filter prediction and updating operations at an updating frequency equivalent to the sampling frequency.

5. A control system for controlling an active magnetic bearing equipping a rotating machine comprising a rotor and a stator,
   the control system being provided with at least one means for measuring radial positions of the rotor with respect to the stator as a function of a signal from at least two position sensors, and at least two control loops of the active magnetic bearing as a function of the radial positions of the rotor, each of the at least two control loops of the active magnetic bearing being provided with at least one synchronous filter that is a function of a rotation speed of the rotor with respect to the stator, the control system further comprising:
   a means for determining the rotation speed of the rotor with respect to the stator, receiving as input measurements of radial position of the rotor from a measurement means, and as a function of the measurements of radial position of the rotor performed over a predetermined time while the rotation speed of the rotor is zero, the means for determining the rotation speed comprising an extended Kalman filter, wherein the extended Kalman filter is initialized by a state vector that is a function of the mean deviation of the radial position of the rotor at zero rotation speed and by a covariance matrix that is a function of the standard deviations of the radial positions of the rotor at zero rotation speed over the predetermined measurement time.

6. The system according to claim 5, wherein a state vector depends on an angular position of the rotor, on the rotation speed of the rotor, on values of offset, and on a radius of an orbit described by the at least two position sensors.

7. The system according to claim 6, wherein the state vector also depends on the measurement means of the active magnetic bearing.

8. The system according to claim 5, wherein the extended Kalman filter is initialized by a state vector that is a function of the mean deviation of the radial position of the rotor at zero rotation speed and by a covariance matrix that is a function of the standard deviation of the radial position of the rotor at zero rotation speed over the predetermined measurement time, determined by each of the measurement means.

9. The system according to claim 5, wherein the measurement means is configured to determine the values of radial position of the rotor at a sampling frequency of the at least two control loops, the means for determining the rotation speed performing extended Kalman filter prediction and updating operations at an updating frequency equivalent to the sampling frequency.

10. A control system for controlling a first active magnetic bearing equipping a rotating machine comprising a rotor and a stator,
   the control system being provided with at least one means for measuring radial positions of the rotor with respect to the stator as a function of a signal from at least two position sensors, and at least two control loops of the active magnetic bearing as a function of the radial positions of the rotor, each of the at least two control loops of the active magnetic bearing being provided with at least one synchronous filter that is a function of a rotation speed of the rotor with respect to the stator, the control system further comprising:
   a means for determining the rotation speed of the rotor with respect to the stator, the stator receiving as input measurements of radial position of the rotor from a measurement means, and as a function of measurements of radial position of the rotor performed over a predetermined time while the rotation speed of the rotor is zero, wherein, the rotating machine being provided with a second active magnetic bearing, the means for determining the rotation speed of the rotor receives as input, from a measurement means of the second active magnetic bearing, measurements of radial position of the rotor and measurements of radial position of the rotor performed over a predetermined time while the rotation speed of the rotor is zero, and wherein the means for determining the rotation speed of the rotor is configured to determine the rotation speed of the rotor as a function of the measurements received from the measurement means of the first active magnetic bearing and the second active magnetic bearing.

11. The control system according to claim 10, wherein the means for determining the rotation speed comprises an extended Kalman filter.

12. The control system according to claim 11, wherein the extended Kalman filter is initialized by a state vector that is a function of the mean deviation of the radial position of the rotor at zero rotation speed and by a covariance matrix that is a function of the standard deviation of the radial position of the rotor at zero rotation speed over the predetermined measurement time, determined by each of the measurement means.

13. The control system according to claim 12, wherein the state vector depends on an angular position of the rotor, on the rotation speed of the rotor, on values of offset, on a radius of an orbit described by the at least two position sensors, on the measurement means of the first active magnetic bearing, received from the measurement means of the second active magnetic bearing and a value of an angular phase shift between the first active magnetic bearing and the second active magnetic in order to take account of the possible movements of the rotor.

14. The system according to claim 11, wherein a state vector depends on an angular position of the rotor, on the rotation speed of the rotor, on values of offset, and on a radius of an orbit described by the at least two position sensors.

15. The system according to claim 10, wherein the measurement means is configured to determine the values of radial position of the rotor at a sampling frequency of the at least two control loops, the means for determining the rotation speed performing extended Kalman filter prediction and updating operations at an updating frequency equivalent to the sampling frequency.

16. A method for controlling a first active magnetic bearing equipping a rotating machine comprising a rotor and a stator,
the control method comprising at least one step of:
measuring the radial position of the rotor with respect to the stator as a function of a signal from at least two position sensors,
controlling the active magnetic bearing as a function of the radial position of the rotor, the step of controlling the magnetic bearing comprising at least one step of: synchronous filtering as a function of the rotation speed of the rotor,
performing a measurement step determining the rotation speed of the rotor with respect to the stator as a function of the measurements, of radial position of the rotor and of radial angular position of the rotor performed over a predetermined time while the rotation speed of the rotor is zero,
providing a second active magnetic bearing, the means for determining the rotation speed of the rotor receives as an input, from a measurement means of the second active magnetic bearing, measurements of radial position of the rotor and measurements of radial position of the rotor performed over a predetermined time while the rotation speed of the rotor is zero, and wherein the means for determining the rotation speed of the rotor is configured to determine the rotation speed of the rotor as a function of the measurements received from the measurement means of the first active magnetic bearing and the second active magnetic bearing.

* * * * *